455-608 AU 233 EX

FIP8106 XR 3,283,207

CROSS REFERENCE EXAMINER

Nov. 1, 1966 M. KLEIN 3,283,207

LIGHT-EMITTING TRANSISTOR SYSTEM

Filed May 27, 1963

Gallium arsenide
" Phosphide

INVENTOR
MELVIN KLEIN

BY Everett A. Gartrell

ATTORNEY

United States Patent Office 3,283,207
Patented Nov. 1, 1966

3,283,207
LIGHT-EMITTING TRANSISTOR SYSTEM

Melvin Klein, Poughkeepsie, N.Y., assignor to International Business Machines Corporation, New York, N.Y., a corporation of New York Filed May 27, 1963, Ser. No. 283,414
5 Claims. (Cl. 315—326)

The present invention is directed to light-emitting transistor systems.

Widespread interest has recently been shown by the electronics industry and the government in semiconductor light sources. Intermetallic semiconductor diodes of materials such as gallium arsenide and gallium arsenide phosphide have evoked particular attention because of their abilities to emit incoherent and coherent light under different operating conditions. Such a diode light source comprises a PN junction that is operated under pulsed conditions so as to establish a forward bias which develops light in the vicinity of the junction. Energy to control the light emission is delivered from a suitable power supply through a control system which includes transistor switching elements and circuits. This switching system is more complex and costly than it is desired for some purposes.

For some applications where space considerations are important, it is desirable to employ a compact unitary structure comprising a semiconductor light source and associated control means for translating electrical energy between the power supply and the light source. The loss in electrical energy during this translation should be low. Heretofore a unitary or self-contained combination of a semiconductor light source and its associated control means have not been available, in so far as applicant is aware.

It is an object of the invention, therefore, to provide a new and improved semiconductor light source which is self-contained with the control means that translates the electrical energy to the light source.

It is another object of the invention to provide a new and improved light-emitting transistor.

It is a further object of the invention to provide a new and improved unitary structure comprising a semiconductor light source and an associated control system for translating controlled electrical enargy to that source.

In accordance with a particular form of the present invention, a light-emitting transistor system comprises a transistor of intermetallic semiconductor material including a base region of one conductivity type intermediate and contiguous with emitter and collector regions of opposite conductivity type and defining PN junctions therewith, the aforesaid base region having a thickness which provides the transistor with a high beta. The transistor system also includes circuit means connecting the transistor in a common emitter configuration and including means for reversely biasing the collector region with respect to the base region and further including control means for applying to the emitter and base regions an electrical control signal having a characteristic effective to establish between the emitter and collector regions a current flow which is large with respect to that of the control signal for driving the transistor into saturation, thereby forwardly biasing the collector region with respect to the base region and developing a light output adjacent the collector-base junction.

The foregoing and other objects, features and advantages of the invention will be apparent from the following more particular description of preferred embodiments of the invention, as illustrated in the accompanying drawing.

DESCRIPTION OF FIG. 1 LIGHT-EMITTING TRANSISTOR SYSTEM

Figure 1:
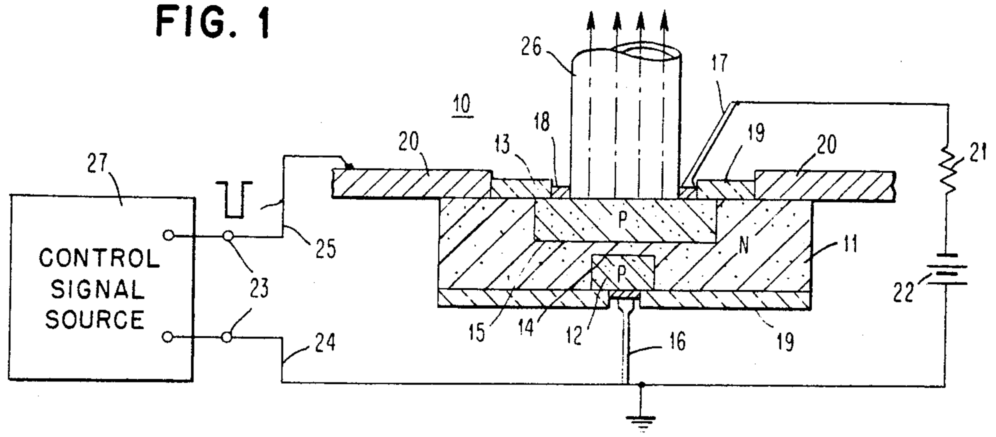
FIG. 1 is a schematic circuit diagram of a light-emitting transistor system in accordance with the present invention, with the transistor thereof represented in section.

Referring now to FIG. 1 of the drawing, the light-emitting transistor system there represented comprises a transistor 10 of intermetallic semiconductor material including a base region 11 of one conductivity type intermediate and contiguous with emitter and collector regions 12 and 13, respectively, of the opposite conductivity type and defining PN junctions 14 and 15. The intermetallic semiconductor material employed in the transistor is a material such as gallium arsenide or gallium arsenide phosphide which is capable of emitting light when electrical current is passed in a forward direction through a PN junction therein. Although the junctions 14 and 15 may be fabricated by alloying or diffusing operations, they are represented as being made by diffusion techniques. To that end, the emitter and base regions 12 and 13, respectively, may be formed by diffusing zinc in a conventional manner into selected areas of the N-type starting wafer which serves as the base region 11. The diffusing operation is conducted at a temperature and for a sufficient time so that the effective thickness of the base region between the junctions 14 and 15 is such that the transistor will have a high beta, beta being the ratio of the developed collector current to applied base current. To that end, the base thickness under consideration preferably is not greater than 1 micron.

The transistor 10 includes an emitter terminal 16 which is ohmically attached to the emitter region 12 in a conventional manner. A collector terminal 17 is suitably attached to a ring 18 of conductive material ohmically bonded to a peripheral portion of the collector region 13. Insulating films 19, 19 of a suitable material such as silicon dioxide or a composite film such as a first film silicon dioxide having a thin glass sheath or film thereover are applied to portions of the upper and lower surfaces of the transistor, as represented, to protect from contamination those portions of the junctions 14 and 15 which extend to those surfaces. Composite films may be applied in the manner disclosed and claimed in the copending application of John A. Perri and Jacob Riseman, Serial Number 141,669, filed September 25, 1961, now patent No. 3,247,428, entitled "Coated Objects and Methods of Providing the Protective Coverings Therefor" and assigned to the same assignee as the present invention. Briefly, this surface coating is accomplished by the thermal decomposition of a siloxane compound in the manner disclosed in Patent 3,089,793 to Eugene L. Jordan and Daniel J. Donahue, granted May 14, 1963 and entitled "Semi-conductor Devices and Methods of Making Them" to produce a silicon dioxide film on the device surfaces. Thereafter a thin glass film is applied to the silicon dioxide film by centrifuging the device in an organic fluid containing a suspension of finely divided glass particles to form a thin uniform layer of the glass particles on the silicon dioxide film, and then chemically bonding the particles to the silicon dioxide film to produce a composite film 19. The copending application of William A. Pliskin and Ernest E. Conrad, Serial Number 141,668, filed September 29, 1961, 3,212,921 entitled "Method of Forming a Glass Film on an Object and the Product Produced Thereby" and assigned to the same assignee as the present invention, discloses and claims the technique for centrifuging the glass particles and thereafter forming them into a very thin hole-free glass film by heating the glass particles above the softening temperature of the particles. Conventional etching operations may be employed for opening up suitable holes in the composite insulating and protective films 19, 19 to expose portions of the semiconductor material thereunder so that terminals and the like may be applied thereto. A base tab or tabs 20, 20 may be ohmically attached to the base region in a conventional manner.

The light-emitting transistor system of the invention further comprises circuit means connecting the transistor 10 in a common emitter configuration and includes means for reversely biasing the collector region 13 with respect to the base region 11. The emitter region 12 is grounded through its terminal 16 which is common to the collector and base circuits of the transistor. The collector terminal 17 is connected to the emitter terminal 16 through a resistor 21 and a potential source or battery 22 which is poled so as reversely to bias the collector-base junction 15.

The circuit means under consideration also includes control means comprising a pair of terminals 23, 23 and connections 24 and 25 for applying to the emitter and base regions 12 and 11 an electrical control signal having a characteristic effective to establish between the emitter and collector regions 12 and 13 a current flow which is large with respect to that of the control signal applied to the terminals 23, 23 for driving the transistor 10 into saturation, thereby forwardly biasing the collector region 13 with respect to the base region 11 and developing a light output (represented by the dash-dot line arrows) adjacent the collector-base junction 15. This light output is represented as being translated by a light pipe 26 which may be of a suitable transparent material such as glass bonded or otherwise applied to the upper surface of the collector region 13. It will be understood, however, that some other medium such as air may be employed for translating the developed light to a suitable light-responsive utilizing device (not shown) such as a silicon photocell. Connection 24 is connected between one of the terminals 23, 23 and the emitter terminal 16 while connection 25 is connected between the other of the terminals and a base tab 20. A control signal source 27 supplies a suitable signal to the terminals 23, 23. This source may be a conventional signal generator such as an alternating-signal generator, but preferably is a pulse generator for developing recurrent pulses having a characteristic effective to render the transistor heavily conductive and drive it into saturation. To that end, the developed pulses are negative-going and have an amplitude and duration as well as frequency selected to produce saturation in the transistor without destroying or otherwise impairing the device.

EXPLANATION OF OPERATION OF FIG. 1 SYSTEM

Considering now the operation of the light-emitting transistor system of FIG. 1, the application of a negative-going signal such as a pulse-type signal to the base region 13 of the transistor 10 renders it heavily conductive. Since a common emitter circuit is employed and the effective thickness of the base region 13 is made small to provide a high beta, small changes in the base current are effective to develop large changes in the collector current, and the transistor is driven into saturation. This now forwardly biases the collector region 13 with respect to the base region 11 and there is developed adjacent the collector-base junction a light output which is translated by the light pipe 26 for utilization by a suitable light-responsive means. Infrared light is developed when gallium arsenide is the semiconductor material employed in the transistor. In the absence of optically flat semiconductor surfaces produced by cleaving or by polishing to produce reflecting surfaces and an optically resonant semiconductor structure, incoherent light is produced.

Light emission ceases when the magnitude of the applied signal diminishes to the extent that saturation of the transistor 10 ceases. Thus small variations in a characteristic of the control signal such as the amplitude or periodicity thereof may be employed to modulate the light output of the transistor or switch it on and off. Accordingly, the light output may be representative of the applied electrical signal. The higher the beta of the transistor, the smaller will be the magnitude of the applied signal that is required to drive the transistor into saturation. Because materials such as gallium arsenide have short recombination lifetimes, those materials augment their light-producing quality with a high-speed switching or modulating capability. It will be manifest that by refrigerating the transistor of the system, greater light output may be realized because the possibility of damage to the transistor by overheating may be materially reduced.

The transistor of the light-emitting transistor system described above experiences a smaller voltage drop across its emitter and collector regions than that which occurs across the terminals of a light-emitting diode. This is particularly advantageous in that the transistor system is capable of operating at a higher duty cycle because the transistor itself is required to dissipate that energy. In addition to this benefit, the unitary construction of the system is such that its compactness affords a desired saving in space. Furthermore, the control signal current required to operate the transistor is smaller by the order of magnitude of the beta of the transistor than the current required to operate a light-emitting diode.

The light-emitting transistor system of the invention has utility in connection with voice and video modulation of light, in multiplexing systems, and as light sources for punched card and tape readers.

DESCRIPTION OF LIGHT-EMITTING TRANSISTOR OF FIG. 2

Figure 2:
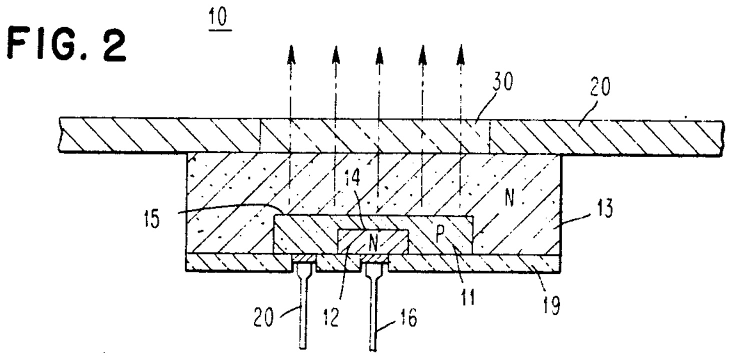
FIG. 2 is a sectional view of a modified light-emitting transistor.

Referring now to FIG. 2, the light-emitting transistor there represented is generally similar to that of FIG. 1. Accordingly, corresponding elements, although they may be of somewhat different configuration, are designated by the same reference numerals in both figures. It will be seen that the transistor 10 is one of the so-called planar structures of the NPN type wherein all the junctions come to the surface which is in a single plane. The N-type collector region 13 constitutes a starting wafer of, for example, gallium arsenide doped with tellurium, and the base and emitter regions 11 and 12 are made in successive diffusion steps. Zinc may be employed as the diffusant to form the P-type base region 11. To form the N-type emitter region 12, sulphur, selenium or tellurium are diffused into a selected portion of the P-type base region. This may be accomplished by the procedure disclosed and claimed in the copending application of Tsu-Hsing Yeh and Robert M. DeFries, Serial Number 268,667, filed March 28, 1963, entitled "Intermetallic Semiconductor Body and Method of Diffusing an N-Type Impurity Thereinto" and assigned to the same assignee as the present invention. Briefly, the N-type impurity is diffused into selected areas through a thin coherent film of silicon monoxide having a thickness in the range of 2,000–20,000 Angstroms (2,500 Angstroms being typical) while the remaining areas of the semiconductor body are covered by a substantially thicker silicon monoxide film which serves as a diffusion mask. The thin film inhibits the formation of undesired compounds or chalcogenides on the selected surfaces of the intermetallic material, and in turn permits the diffusion into the semiconductor wafer of the N-type impurity which otherwise would not occur. Emitter and base terminals 16 and 20 are then applied to their respective regions in a conventional manner while an apertured plate 18 serves as the collector terminal. If desired, a glass or other transparent coating 30 may be embedded in the aperture in the plate 18.

The operation of the transistor of FIG. 2 is essentially the same as that of the transistor of FIG. 1 and hence will not be repeated. It will be appreciated, however, that a control signal and a collector biasing potential of opposite polarity to that employed in FIG. 1 will be used in connection with the transistor of FIG. 2 because it is of the opposite conductivity type.

DESCRIPTION OF LIGHT-EMITTING TRANSISTOR OF FIG. 3

Figure 3:
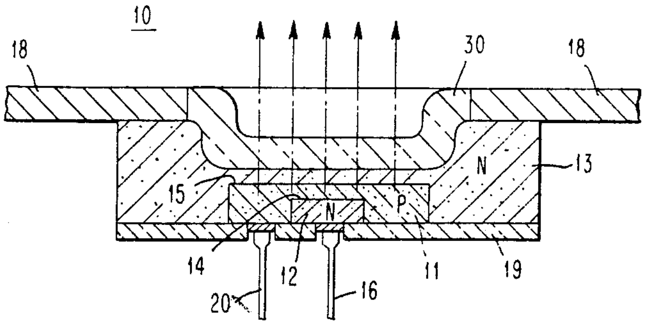
FIG. 3 is a similar view of a further modification of the transistor.

The transistor of FIG. 3 is almost identical with that of FIG. 2, differing only in that a portion of the collector region 13 has been etched away to provide a thin passage for the developed light passing through the collector region.

While the invention has been particularly shown and described with reference to preferred embodiments thereof, it will be understood by those skilled in the art that various changes in form and details may be made therein without departing from the spirit and scope of the invention.

What is claimed is:

1. A light-emitting transistor system comprising:

a transistor of intermetallic semiconductor material including a base region of one conductivity type intermediate and contiguous with emitter and collector regions of the opposite conductivity type and defining PN junctions therewith, said base region having a thickness not greater than one micron which provides said transistor with a high beta; and circuit means connecting said transistor in a common emitter configuration and including means for reversely biasing said collector region with respect to said base region and further including control means for applying to said emitter and base regions an electrical control signal having a characteristic effective to establish between said emitter and collector regions a current flow which is large with respect to that of said control signal for driving said transistor into saturation, thereby forwardly biasing said collector region with respect to said base region and developing a light output adjacent the collector-base junction.

2. A light-emitting transistor system comprising:

an NPN transistor of intermetallic semiconductor material including a base region of one conductivity type intermediate and contiguous with emitter and collector regions of the opposite conductivity type and defining PN junctions therewith, said base region having a thickness not greater than 1 micron which provides said transistor with a high beta; and circuit means connecting said transistor in a common emitter configuration and including means for reversely biasing said collector region with respect to said base region and further including control means for applying to said emitter and base regions an electrical control signal having a characteristic effective to establish between said emitter and collector regions a current flow which is large with respect to that of said control signal for driving said transistor into saturation, thereby forwardly biasing said collector region with respect to said base region and developing a light output adjacent the collector-base junction.

3. A light-emitting transistor system comprising:

a transistor of intermetallic semiconductor material including a base region of one conductivity type intermediate and contiguous with emitter and collector regions of the opposite conductivity type and defining PN junctions therewith, said base region having a thickness not greater than 1 micron which provides said transistor with a high beta; and circuit means connecting said transistor in a common emitter configuration and including means for reversely biasing said collector region with respect to said base region and further including control means for applying to said emitter and base regions electrical control pulses having a characteristic effective to establish between said emitter and collector regions a current flow which is large with respect to that of said control signal for driving said transistor into saturation, thereby forwardly biasing said collector region with respect to said base region and developing a light output adjacent the collector-base junction.

4. A light-emitting transistor system comprising:

a transistor of intermetallic semiconductor material including a base region of one conductivity type intermediate and contiguous with emitter and collector regions of the opposite conductivity type and defining PN junctions therewith, said base region having a thickness not greater than 1 micron which provides said transistor with a high beta; and circuit means connecting said transistor in a common emitter configuration and including means for reversely biasing said collector region with respect to said base region and further including pulse generating means for applying to said emitter and base regions unidirectional control pulses having a characteristic effective to establish between said emitter and collector regions a current flow which is large with respect to that of said control signal for driving said transistor into saturation, thereby forwardly biasing said collector region with respect to said base region and developing a light output adjacent the collector-base junction.

5. A light-emitting transistor system comprising:

a PNP transistor of intermetallic semiconductor material including a base region of one conductivity type intermediate and contiguous with emitter and collector regions of the opposite conductivity type and defining PN junctions therewith, said base region having a thickness not greater than 1 micron which provides said transistor with a high beta; and circuit means connecting said transistor in a common emitter configuration and including means for reversely biasing said collector region with respect to said base region and further including control means for applying to said emitter and base regions an electrical control signal having a characteristic effective to establish between said emitter and collector regions a current flow which is large with respect to that of said control signal for driving said transistor into saturation, thereby forwardly biasing said collector region with respect to said base region and developing a light output adjacent the collector-base junction.

References Cited by the Examiner

UNITED STATES PATENTS

| | | | |
|---|---|---|---|
| 2,981,851 | 4/1961 | Wier | 307—88.5 |
| 3,057,762 | 10/1962 | Gans | 317—235 |

FOREIGN PATENTS

| | | |
|---|---|---|
| 955,977 | 1/1957 | Germany. |

OTHER REFERENCES

Proc. I.E.E.E. January 1963, vol. 51, No. 1 page 219, Fig. 2.

DAVID J. GALVIN, *Primary Examiner.*